US012586620B2

(12) United States Patent
Sheng

(10) Patent No.: US 12,586,620 B2
(45) Date of Patent: Mar. 24, 2026

(54) MEMORY DEVICE INCLUDING SUB-CONTROL CIRCUIT WITH ASYNCHRONOUS CONTROL LOGIC

(71) Applicant: YANGTZE MEMORY TECHNOLOGIES CO., LTD., Wuhan (CN)

(72) Inventor: Yue Sheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 219 days.

(21) Appl. No.: 18/509,905

(22) Filed: Nov. 15, 2023

(65) Prior Publication Data

US 2025/0149074 A1      May 8, 2025

(30) Foreign Application Priority Data

Nov. 6, 2023      (CN) .......................... 202311483945.9

(51) Int. Cl.
G11C 7/22      (2006.01)
G11C 7/10      (2006.01)
H03K 19/21      (2006.01)

(52) U.S. Cl.
CPC ............ G11C 7/222 (2013.01); G11C 7/1012 (2013.01); H03K 19/21 (2013.01)

(58) Field of Classification Search
CPC ....... G11C 7/222; G11C 7/1012; H03K 19/21
See application file for complete search history.

(56) References Cited

U.S. PATENT DOCUMENTS

| | | | |
|---|---|---|---|
| 5,084,636 A | 1/1992 | Yoneda | |
| 2007/0130436 A1 | 6/2007 | Shen | |
| 2019/0180824 A1* | 6/2019 | Hsu | ........................ G11C 16/10 |

FOREIGN PATENT DOCUMENTS

| | | |
|---|---|---|
| CN | 1720506 A | 1/2006 |
| CN | 105229623 A | 1/2016 |
| CN | 111512552 A | 8/2020 |

OTHER PUBLICATIONS

D. L. Oliveira, F. F. Nascimento, M. H. Victor and L. C. Moreira, "Design of Locally-Clocked Asynchronous Finite State Machines with no Memory Elements," 2023 IEEE Seventh Ecuador Technical Chapters Meeting (ETCM), Ambato, Ecuador, 2023, pp. 1-6, doi: 10.1109/ETCM58927.2023.10309068. (Year: 2023).*
ETCM cover page for Oliveira NPL date (Year: 2023).*

* cited by examiner

*Primary Examiner* — Amir Zarabian
*Assistant Examiner* — Bradley S Coon
(74) *Attorney, Agent, or Firm* — BAYES PLLC

(57)      ABSTRACT

A memory device includes a memory array configured to store data, and a peripheral circuit coupled to the memory array and including a control logic circuit to control operations of the peripheral circuit. The control logic circuit includes a main control circuit and at least one first sub control circuit, and the main control circuit and the first sub control circuit interact through a first trigger signal and a first indication signal. The main control circuit and the first sub control circuit interact through an asynchronous control logic without a global clock signal.

20 Claims, 10 Drawing Sheets

400

700

800

900

1

MEMORY DEVICE INCLUDING SUB-CONTROL CIRCUIT WITH ASYNCHRONOUS CONTROL LOGIC

CROSS-REFERENCE TO RELATED APPLICATIONS

This application claims the benefit of priority to Chinese Application No. 202311483945.9, filed on Nov. 6, 2023, which is incorporated herein by reference in its entirety.

BACKGROUND

The present disclosure relates to memory devices, control logic circuits, and operations thereof.

The memory device, such as the flash memory, is a low-cost, high-density, non-volatile solid-state storage medium that can be electrically erased and reprogrammed. The peripheral circuit of the memory device usually contains various register circuits and corresponding control logic circuits, and they interact with the main control digital circuit through the global clock and bus protocol to complete the operation of the memory device. However, these global clocks and the routing on the bus are very long, and the power is consumed on clocks and buses.

SUMMARY

In one aspect, a memory device is disclosed. The memory device includes a memory array configured to store data, and a peripheral circuit coupled to the memory array and including a control logic circuit to control operations of the peripheral circuit. The control logic circuit includes a main control circuit and at least one first sub control circuit, and the main control circuit and the first sub control circuit interact through a first trigger signal and a first indication signal.

In some implementations, the main control circuit and the first sub control circuit interact through an asynchronous control logic without a global clock signal.

In some implementations, the first sub control circuit includes an asynchronous control circuit configured to receive the first trigger signal from the main control circuit and generate a local clock signal, and a state machine circuit configured to receive the local clock signal and generate the first indication signal.

In some implementations, the asynchronous control circuit includes a first exclusive OR gate including a first input end, a second input end, and a first output end, wherein the first input end is configured to receive the first trigger signal, and the first output end is configured to output the local clock signal, a flip-flop circuit including an enable end coupled to the first output end of the first exclusive OR gate, a second output end, and a data end coupled to the second output end, and a first delay element disposed between the second input end of the first exclusive OR gate and the second output end of the flip-flop circuit.

In some implementations, the flip-flop circuit includes a D flip-flop. In some implementations, the asynchronous control circuit further includes an inverter between the data end and the second output end of the flip-flop circuit.

In some implementations, the state machine circuit includes at least one state triggered by the local clock signal to switch the state, and the state machine circuit includes a clock input end configured to receive the local clock signal, a third output end configured to output a next signal when switching the state, and an indication output end.

In some implementations, the indication output end is configured to output the first indication signal when the state in the state machine circuit is switched.

In some implementations, the memory device further includes a second exclusive OR gate including a third input end configured to receive the first trigger signal, a fourth input end, and a fourth output end coupled to the asynchronous control circuit, and a second delay element disposed between the fourth input end of the second exclusive OR gate and the third output end of the state machine circuit.

In some implementations, the fourth output end of the second exclusive OR gate is coupled to the first input end of the first exclusive OR gate. In some implementations, the first delay element includes at least one inverter, and the second delay element comprises at least one inverter.

In some implementations, the control logic circuit further includes a second sub control circuit, and the main control circuit and the second sub control circuit interact through a second trigger signal and a second indication signal. In some implementations, the first sub control circuit and the second sub control circuit are independently operated.

In some implementations, the main control circuit is configured to respectively output the first trigger signal and the second trigger signal and respectively receive the first indication signal and the second indication signal.

In another aspect, a control logic circuit for control operations of a peripheral circuit of a memory device is disclosed. The control logic circuit includes a main control circuit and at least one first sub control circuit interacting each other through a first trigger signal and a first indication signal. The sub control circuit includes an asynchronous control circuit configured to receive the first trigger signal and generate a local clock signal, and a state machine circuit configured to receive the local clock signal and generate the first indication signal.

In some implementations, the asynchronous control circuit includes a first exclusive OR gate including a first input end, a second input end, and a first output end, wherein the first input end is configured to receive the first trigger signal, and the first output end is configured to output the local clock signal, a flip-flop circuit including an enable end coupled to the first output end of the first exclusive OR gate, a second output end, and a data end coupled to the second output end, and a first delay element disposed between the second input end of the first exclusive OR gate and the second output end of the flip-flop circuit.

In some implementations, the flip-flop circuit includes a D flip-flop. In some implementations, the asynchronous control circuit further includes an inverter between the data end and the second output end of the flip-flop circuit.

In some implementations, the state machine circuit includes at least one state triggered by the local clock signal to switch the state, and the state machine circuit includes a clock input end configured to receive the local clock signal, a third output end configured to output a next signal when switching the state, and an indication output end.

In some implementations, the indication output end is configured to output the first indication signal when the state in the state machine circuit is switched.

In some implementations, the memory device further includes a second exclusive OR gate including a third input end configured to receive the first trigger signal, a fourth input end, and a fourth output end coupled to the asynchronous control circuit, and a second delay element disposed between the fourth input end of the second exclusive OR gate and the third output end of the state machine circuit.

In some implementations, the fourth output end of the second exclusive OR gate is coupled to the first input end of the first exclusive OR gate. In some implementations, the first delay element includes at least one inverter, and the second delay element comprises at least one inverter.

In some implementations, the control logic circuit further includes a second sub control circuit, and the main control circuit and the second sub control circuit interact through a second trigger signal and a second indication signal. In some implementations, the first sub control circuit and the second sub control circuit are independently operated.

In some implementations, the main control circuit is configured to respectively output the first trigger signal and the second trigger signal and respectively receive the first indication signal and the second indication signal.

In still another aspect, a method of operating a peripheral circuit of a memory device is disclosed. A trigger signal is generated by a main control circuit, the trigger signal is received by a sub control circuit, a local clock signal is generated in the sub control circuit, a state machine circuit in the sub control circuit is triggered by the local clock signal, and an indication signal is generated by the sub control circuit and the indication signal is transmitted to the main control circuit.

In some implementations, the trigger signal and a first delayed signal are combined to generate a request signal, and the request signal is transmitted to an asynchronous control circuit.

In some implementations, the request signal and a second delayed signal are combined to generate the local clock signal.

In some implementations, a flip-flop circuit is triggered by the local clock signal to generate a flip-flop output signal, and the flip-flop output signal is delayed to generate the second delayed signal. In some implementations, the flip-flop output signal is delayed by a delay element.

In some implementations, at least one state is defined in the state machine circuit, and the state in the state machine circuit is sequentially switched when receiving the local clock signal.

In some implementations, a next state signal is generated when switching the state in the state machine circuit, and the next state signal is delayed to generate the first delayed signal.

In some implementations, the indication signal is generated when the state in the state machine circuit is switched, and the indication signal is transmitted to the main control circuit to indicate a completion of an interaction between the main control circuit and the sub control circuit.

In still another aspect, a method of operating a control logic circuit is disclosed. The control logic circuit includes a main control circuit and at least one sub control circuit. A trigger signal from the main control circuit is received by the sub control circuit. A local clock signal is generated in the sub control circuit in response to receiving the trigger signal. A state machine circuit in the sub control circuit is triggered by the local clock signal. An indication signal is generated by the sub control circuit and the indication signal is transmitted to the main control circuit.

In some implementations, the trigger signal and a first delayed signal are combined to generate a request signal, and the request signal is transmitted to an asynchronous control circuit.

In some implementations, the request signal and a second delayed signal are combined to generate the local clock signal.

In some implementations, a flip-flop circuit is triggered by the local clock signal to generate a flip-flop output signal, and the flip-flop output signal is delayed to generate the second delayed signal. In some implementations, the flip-flop output signal is delayed by a delay element.

In some implementations, at least one state is defined in the state machine circuit, and the state in the state machine circuit is sequentially switched when receiving the local clock signal.

In some implementations, a next state signal is generated when switching the state in the state machine circuit, and the next state signal is delayed to generate the first delayed signal.

In some implementations, the indication signal is generated when the state in the state machine circuit is switched, and the indication signal is transmitted to the main control circuit to indicate a completion of an interaction between the main control circuit and the sub control circuit.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1A:
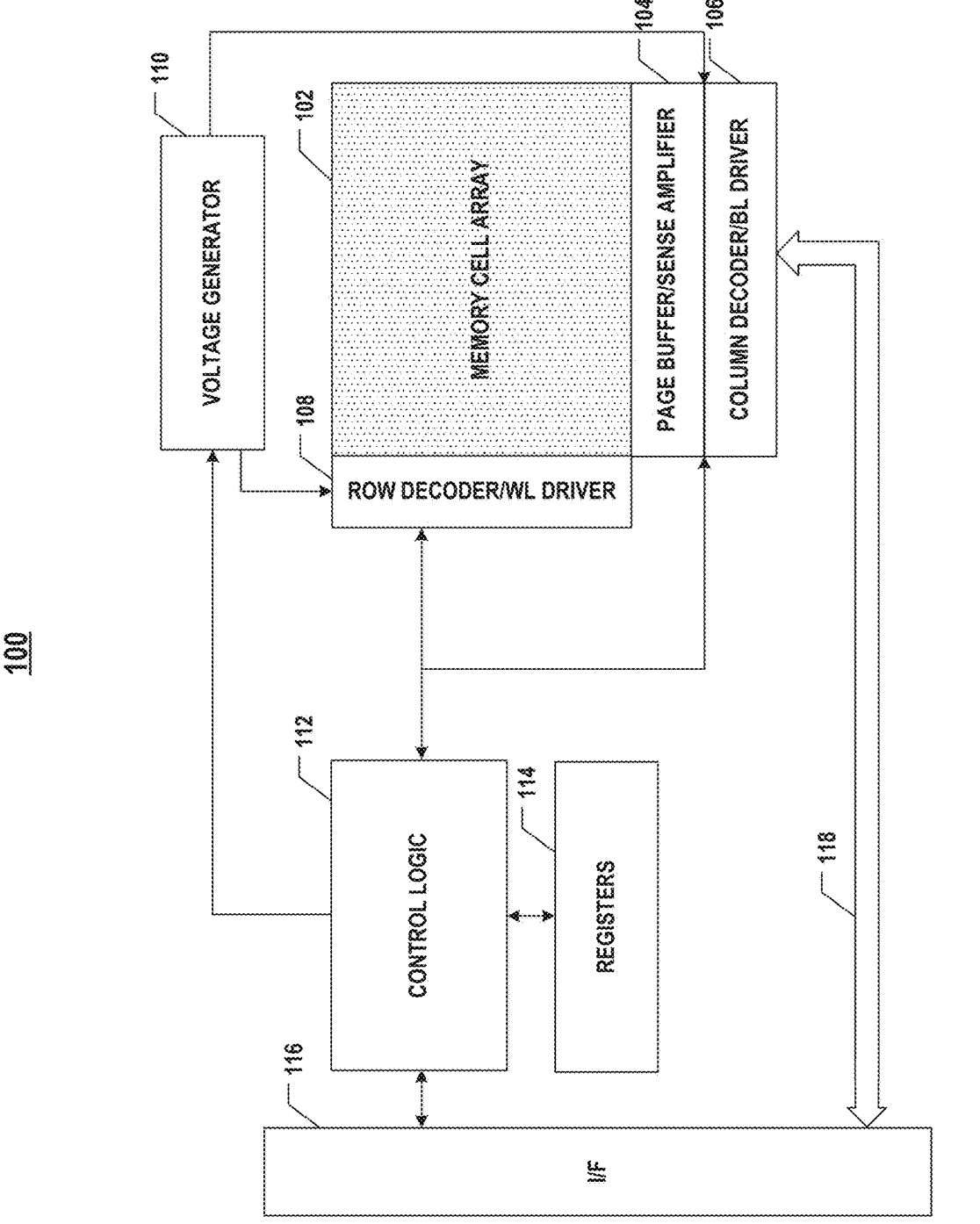
FIG. 1A illustrates a block diagram of an exemplary memory device including a memory cell array and peripheral circuits, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

FIG. 1A illustrates a block diagram of an exemplary memory device 100 including a memory cell array 102 and peripheral circuits, according to some aspects of the present disclosure. In some implementations, the peripheral circuits including a page buffer/sense amplifier 104, a column decoder/bit line driver 106, a row decoder/word line driver 108, a voltage generator 110, control logic 112, registers 114, an interface 116, and a data bus 118. It is understood that in some examples, additional peripheral circuits not shown in FIG. 1 may be included as well.

Page buffer/sense amplifier 104 can be configured to read and program (write) data from and to memory cell array 102 according to the control signals from control logic 112. In one implementation, page buffer/sense amplifier 104 may store one page of program data (write data) to be programmed into one page of memory cell array 102. In another example, page buffer/sense amplifier 104 may perform program verify operations to ensure that the data has been properly programmed into the memory cells coupled to selected word lines. In still another implementation, page buffer/sense amplifier 104 may also sense the low power signals from the bit line that represents a data bit stored in the memory cell and amplify the small voltage swing to recognizable logic levels in a read operation. Column decoder/bit line driver 106 can be configured to be controlled by control logic 112 according to the control signals from control logic 112 and select one or more NAND memory strings by applying bit line voltages generated from voltage generator 110.

Row decoder/word line driver 108 can be configured to be controlled by control logic 112 according to the control signals from control logic 112 and the select/deselect blocks of memory cell array 102 and select/deselect the word lines. Row decoder/word line driver 108 can be further configured to drive the word lines using word line voltages generated from voltage generator 110. Voltage generator 110 can be configured to be controlled by control logic 112 according to the control signals from control logic 112 and generate the word line voltages (e.g., read voltage, program voltage, pass voltage, local voltage, verification voltage, etc.), bit line voltages, and source line voltages to be supplied to memory cell array 102.

Control logic 112 can be coupled to each peripheral circuit described above and configured to control the operations of each peripheral circuit by generating and sending various control signals. As described below in detail, control logic 112 can include a main control unit or main control circuit to communicate or interact with several sub control units or sub control circuits.

Interface 116 can be coupled to control logic 112 and act as an instruction fetcher/buffer as well as an instruction decoder to decode instructions received from a memory controller and relay the decoded instructions to control logic 112. Interface 116 can also buffer and relay status information received from control logic 112 to the memory controller. Interface 116 can be coupled to column decoder/bit line driver 106 via data bus 118 and further act as a data input/output (I/O) interface and a data buffer to buffer and relay the data to and from memory cell array 102.

Figure 1B:
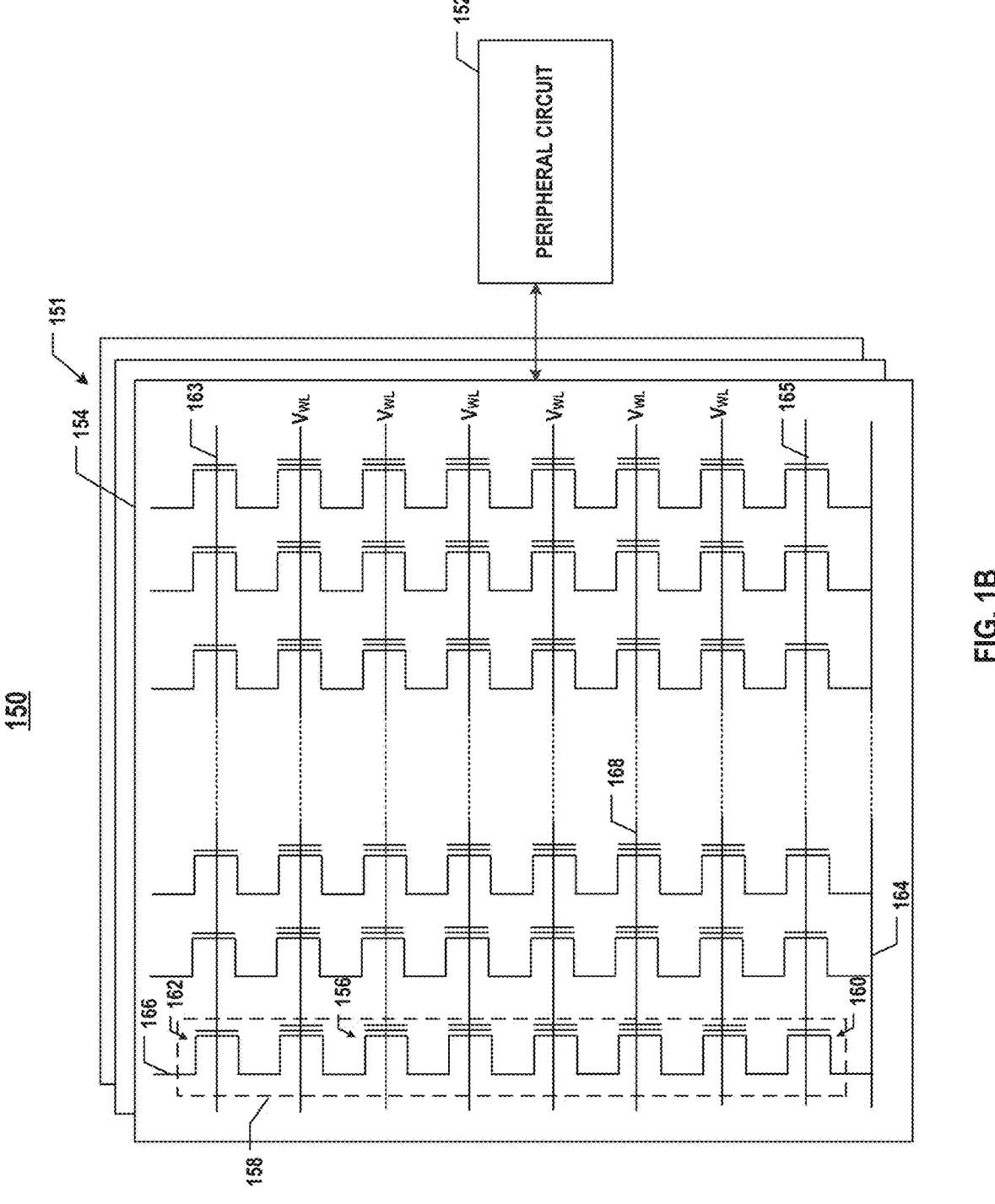
FIG. 1B illustrates a schematic circuit diagram of a memory device including peripheral circuits, according to some aspects of the present disclosure.

FIG. 1B illustrates a schematic circuit diagram of a memory device 150 including peripheral circuits, according to some aspects of the present disclosure. Memory device 150 can include a memory cell array 151 and peripheral circuits 152 coupled to memory cell array 151. Memory device 100 may be an example of memory device 150 in which memory cell array 151 and at least peripheral circuit 152 may be included in peripheral circuit 104.

Memory cell array 151 can be a NAND Flash memory cell array in which memory cells 156 are provided in the form of an array of NAND memory strings 158. In some implementations, each NAND memory string 158 includes a plurality of memory cells 156 coupled in series. Each memory cell 156 can hold a continuous, analog value, such as an electrical voltage or charge, that depends on the number of electrons trapped within a region of memory cell 156. Each memory cell 156 can be either a floating gate type of memory cell including a floating-gate transistor or a charge trap type of memory cell including a charge-trap transistor.

In some implementations, each memory cell 156 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 156 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1B, each NAND memory string 158 can include a source select gate (SSG) transistor 160 at its source end and a drain select gate (DSG) transistor 1622 at its drain end. SSG transistor 1600 and DSG transistor 162 can be configured to activate selected NAND memory strings 158 (columns of the array) during read and program operations. In some implementations, SSG transistors 160 of NAND memory strings 158 in the same block 154 are coupled through a same source line (SL) 164, e.g., a common SL, for example, to the ground. DSG transistor 162 of each NAND memory string 158 is coupled to a respective bit line 166 from which data can be read or programmed via an output bus (not shown), according to some implementations. In some implementations, each NAND memory string 158 is configured to be selected or deselected by applying a select voltage (e.g., above the threshold voltage of DSG transistor 162) or a deselect voltage (e.g., 0 V) to respective DSG transistor 162 through one or more DSG lines 163 and/or by applying a select voltage (e.g., above the threshold voltage of SSG transistor 160) or a deselect voltage (e.g., 0 V) to respective SSG transistor 160 through one or more SSG lines 165.

As shown in FIG. 1B, NAND memory strings 158 can be organized into multiple blocks 154, each of which can have a common source line 164. In some implementations, each block 154 is the basic data unit for erase operations, e.g., all memory cells 156 on the same block 154 are erased at the same time. Memory cells 156 of adjacent NAND memory strings 158 can be coupled through word lines 168 that select which row of memory cells 166 is affected by read and program operations.

Peripheral circuits 152 can be coupled to memory cell array 151 through bit lines 166, word lines 168, source lines 164, SSG lines 165, and DSG lines 163. As described above, peripheral circuits 152 can include any suitable circuits for facilitating the operations of memory cell array 151 by applying and sensing voltage signals and/or current signals through bit lines 166 to and from each target memory cell 156 through word lines 168, source lines 164, SSG lines 165, and DSG lines 163. Peripheral circuits 152 can include various types of peripheral circuits formed using CMOS technologies.

Figure 2:
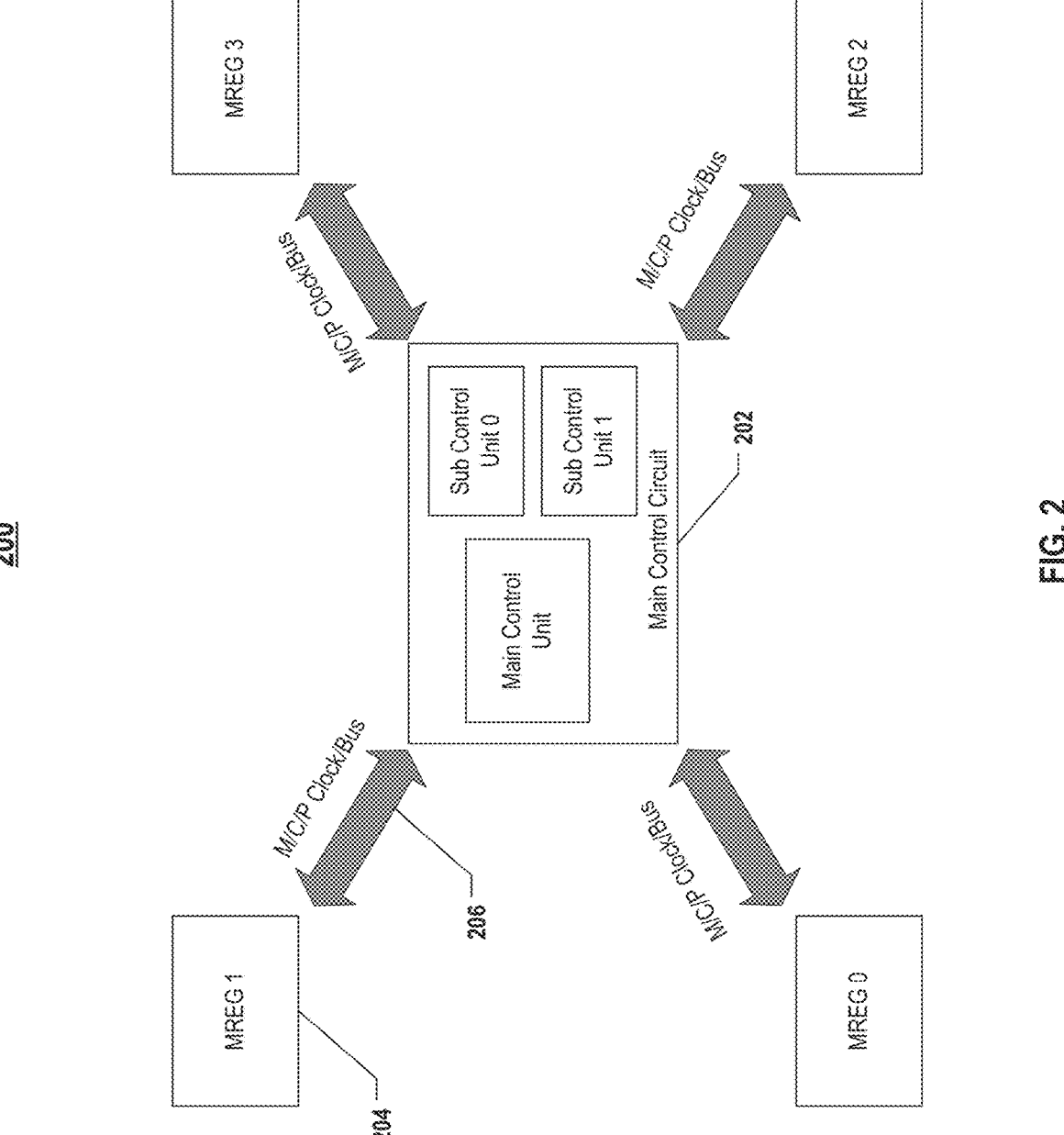
FIG. 2 illustrates a block diagram of an exemplary control logic circuit including a main control circuit and several register circuits, according to some aspects of the present disclosure.

FIG. 2 illustrates a block diagram of an exemplary control logic circuit 200 including a main control circuit 202 and several logic circuits 204, according to some aspects of the present disclosure. In some implementations of the design of the memory device, main control circuit 202 may be placed in the center of the chip, and there are many other circuits, such as logic circuits 204, and their corresponding control circuits scattered in various areas of the chip. In some implementations, logic circuit 204 may include register circuit and related control logic circuits. In some implementations, main control circuit 202 and logic circuit 204 may be placed in control logic 112 in FIG. 1A. In some implementations, main control circuit 202 and logic circuit 204 may be placed in control logic 112 to communicate or control with registers 114, column decoder/bit line driver 106, and row decoder/word line driver 108. In some implementations, these circuits interact with main control circuit 202 relying on a global clock and bus protocol 206. Due to the large area of the memory device, the routing on the global clocks and buses is long, and the power consumption on the global clocks and buses is almost equal to the power consumption of the master digital circuit itself, in some implementations.

The present disclosure provides a simplified asynchronous circuit handshake protocol to generate a local clock signal, which replaces the original digital global clock and bus in the memory device so that the power consumption on the global clock and bus can be completely saved.

Figure 3:
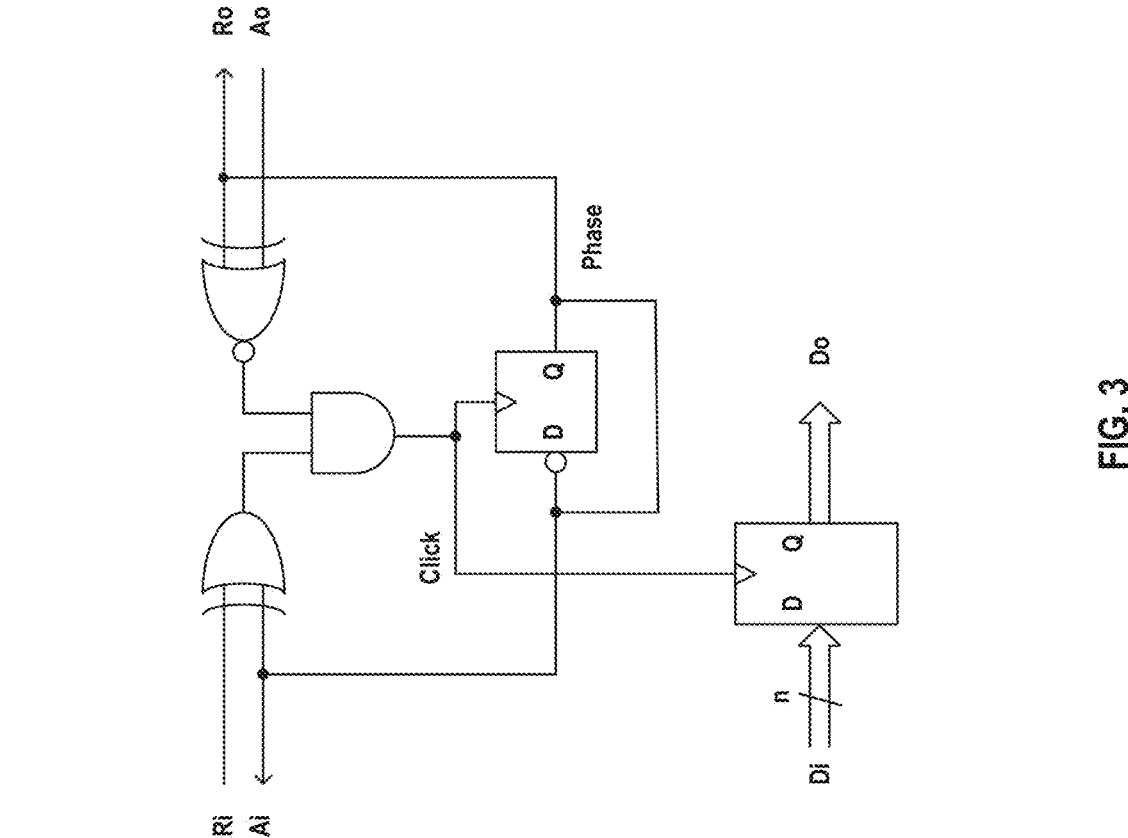
FIG. 3 illustrates a block diagram of an exemplary click element of an asynchronous control circuit, according to some aspects of the present disclosure.

FIG. 3 illustrates a block diagram of an exemplary click element 300 of an asynchronous circuit, according to some aspects of the present disclosure. The asynchronous circuit (clockless or self-timed circuit) is a sequential digital logic circuit that does not need a global clock circuit or signal generator to synchronize its components. Instead, the components are driven by a handshaking circuit which indicates the completion of a set of instructions. The asynchronous circuit is a method of designing digital systems without clocks. Local signaling replaces global synchronization through the exchange of request (req) and acknowledge (ack) signals, in a process known as handshaking, between parts of the circuit that send and receive data. In addition to the elimination of clock skew, other potential advantages of an asynchronous system include average-case performance, lower energy consumption, and robustness. The handshaking works by simple data transfer protocols. In some implementations, the handshaking circuit or the handshaking protocol may be achieved by click element 300 which uses the request signals (Ri, Ro) and the acknowledge signals (Ai, Ao) to complete the communication between the main control circuit and the registers, as shown in FIG. 3.

Figure 4:
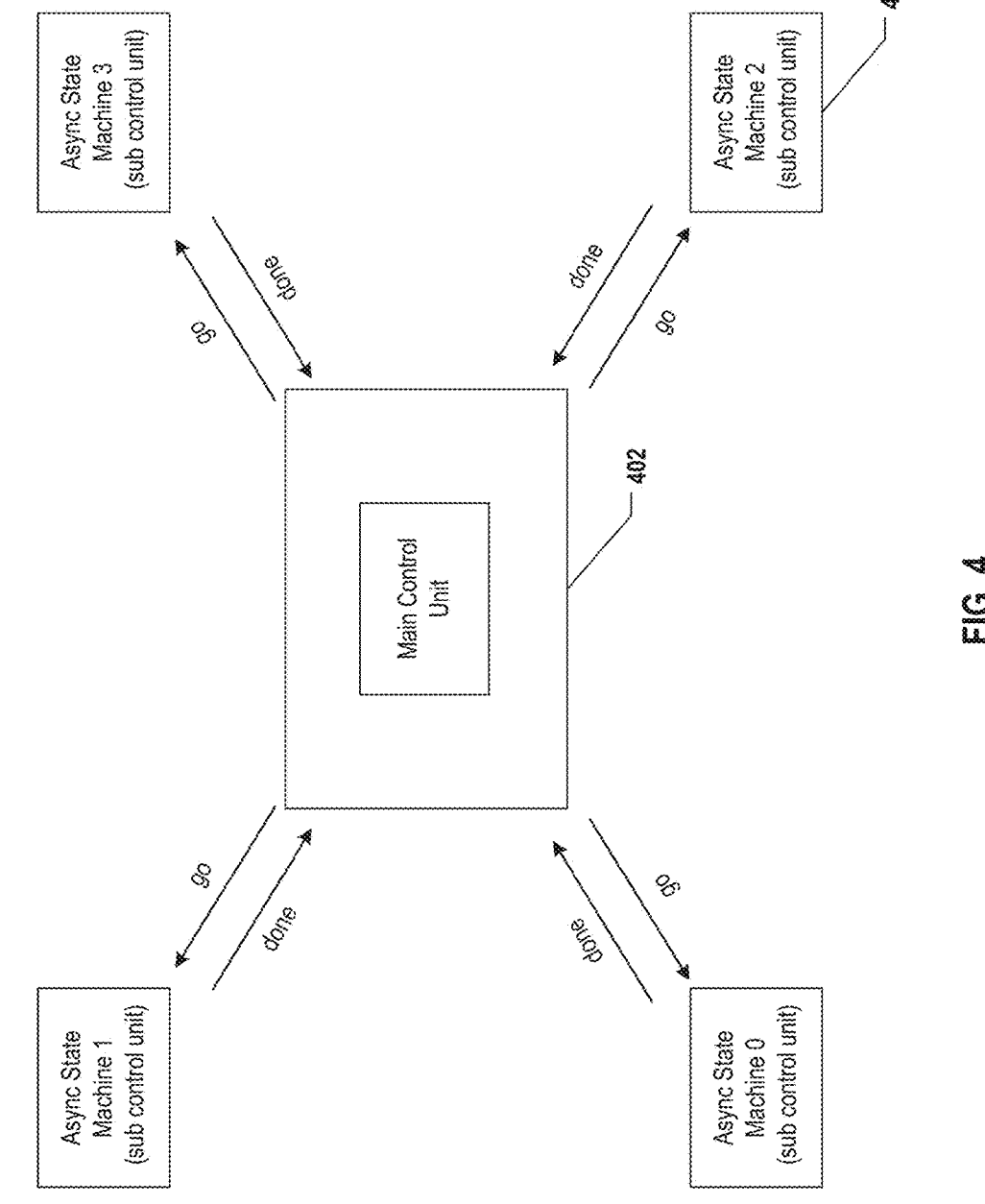
FIG. 4 illustrates a block diagram of an exemplary control logic circuit including a main control circuit and several sub control circuits, according to some aspects of the present disclosure.

FIG. 4 illustrates a block diagram of an exemplary control logic circuit 400 including a main control circuit 402 and several sub control circuits 404, according to some aspects of the present disclosure. In some implementations, main control circuit 402 and sub control circuits 404 may be placed in control logic 112 in FIG. 1A. In some implementations, main control circuit 402 and sub control circuits 404 may be placed in control logic 112 to communicate or control with registers 114, column decoder/bit line driver 106, and row decoder/word line driver 108. As shown in FIG. 4, main control circuit 402 and sub control circuits 404 interact or communicate through a trigger signal (request signal) "go" and an indication signal (acknowledge signal) "done" without a global clock signal. In some implementations, main control circuit 402 may send a "go" signal to sub control circuits 404 to indicate the beginning of the data transmission and sub control circuits 404 may send back a "done" signal to main control circuit 402 to indicate the completion of the data transmission.

In some implementations, control logic circuit 400 may include one main control circuit 402 and several different sub control circuits 404. The trigger signals "go" and the indication signals "done" between main control circuit 402 and different sub control circuits 404 may be operated independently. In other words, main control circuit 402 respectively outputs the trigger signals to different sub control circuits 404 and respectively receives the indication signals from different sub control circuits 404.

By using this handshaking protocol, a local clock signal is generated in sub control circuits 404 to replace the global clock and bus in the memory device so that the power consumption on the global clock and bus can be completely saved.

Figure 5:
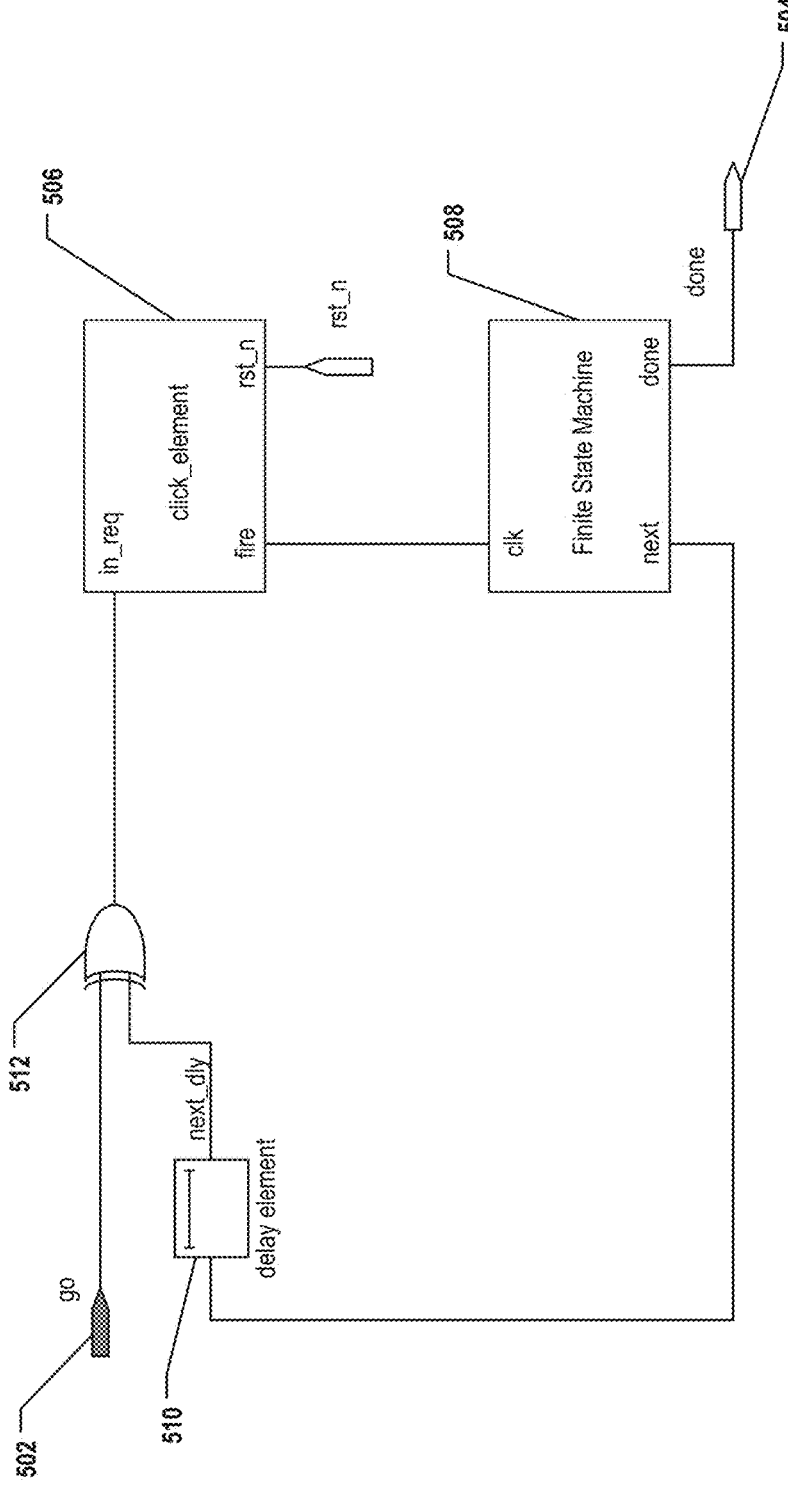
FIG. 5 illustrates a block diagram of an exemplary sub control circuit, according to some aspects of the present disclosure.

FIG. 5 illustrates a block diagram of an exemplary sub control circuit 404, according to some aspects of the present disclosure. In some implementations, sub control circuit 404 may include an asynchronous control circuit 506 and a state machine circuit 508. In some implementations, asynchronous control circuit 506 may be a click element receiving the trigger signal 502 "go" generated by main control circuit 402. In some implementations, asynchronous control circuit 506 may generate a local clock signal "fire" and provides the local clock signal "fire" to state machine circuit 508.

In some implementations, state machine circuit 508 may include at least one state triggered by the local clock signal "fire" to switch the state. In some implementations, state machine circuit 508 may have a local clock input end "clk" receiving the local clock signal "fire" from asynchronous control circuit 506. In some implementations, the number of states in state machine circuit 508 may be predefined based on the actual applications and is not limited. In some implementations, every time when the state in state machine circuit 508 is switched to a next state, state machine circuit 508 may output a signal "next" at an output end to indicate the switching of the state. In some implementations, when all states defined in state machine circuit 508 are completely switched, state machine circuit 508 may output an indication signal 504 "done" at another output end to indicate the completion of data transmission, and the indication signal "done" is transmitted back to main control circuit 402.

In some implementations, sub control circuit 404 may further include a delay element 510 and an exclusive OR gate 512. In some implementations, exclusive OR gate 512 may include an input end receiving trigger signal 502 "go" generated by main control circuit 402 and another input end receiving the signal "next_dly" delayed by delay element 510. Delay element 510 is disposed between the input end of exclusive OR gate 512 and the output end of state machine circuit 508 outputting the signal "next." In some implementations, delay element 510 may be an investor to delay the signal "next" for a predefined time. In some implementations, the predefined time of delay element 510 may be used to define a low time of the local clock signal "fire."

In some implementations, exclusive OR gate 512 may combine the delayed signal "next_dly" delayed by delay element 510 with trigger signal 502 "go" to generate a request signal, and the request signal is provided to asynchronous control circuit 506 as the trigger signal "in_req".

Figure 6:
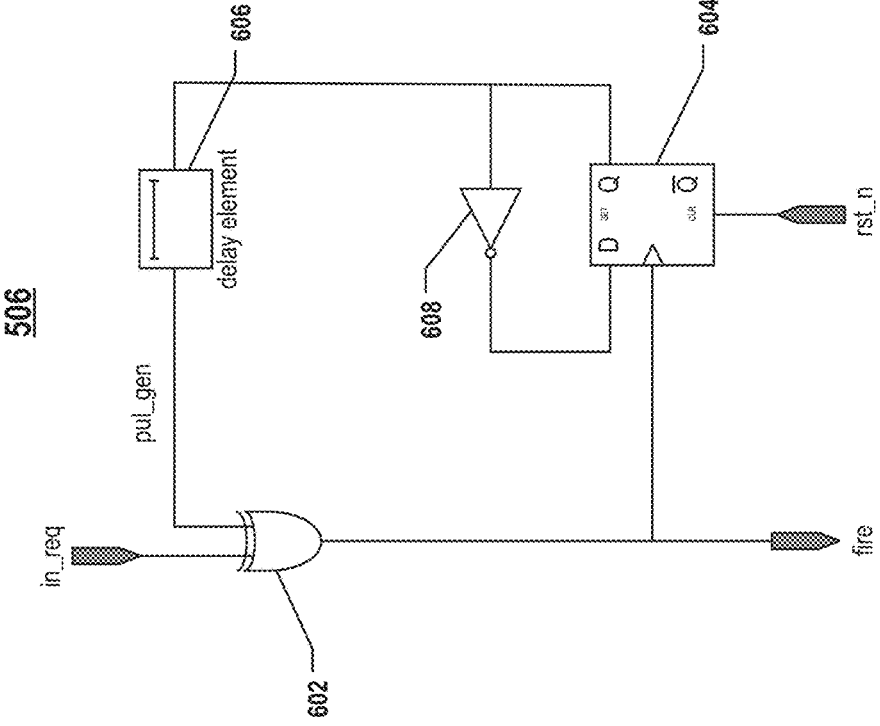
FIG. 6 illustrates a block diagram of an exemplary asynchronous control circuit, according to some aspects of the present disclosure.

FIG. 6 illustrates a block diagram of asynchronous control circuit 506, according to some aspects of the present disclosure. As shown in FIG. 6, asynchronous control circuit 506 may include an exclusive OR gate 602, a flip-flop circuit 604, and a delay element 606. Exclusive OR gate 602 may include an input end receiving the trigger signal "in_req" which is from the trigger signal 502 "go." Exclusive OR gate 602 may include another input end receiving a signal "pul_gen" from delay element 606, and exclusive OR gate 602 combines the trigger signal "in_req" and the signal "pul_gen" to generate the local clock signal "fire" at the output end of exclusive OR gate 602. In some implementations, flip-flop circuit 604 may include an enable end coupled to the output end of exclusive OR gate 602, and the local clock signal "fire" may be also provided to enable flip-flop circuit 604.

In some implementations, flip-flop circuit 604 may be a D flip-flop. In some implementations, flip-flop circuit 604 may include an output end coupled to a data end of flip-flop circuit 604 through an inverter 608. In some implementations, delay element 606 is disposed between the input end of exclusive OR gate 602 and the output end of flip-flop circuit 604 to delay the output signal of flip-flop circuit 604 for a predefined time. In some implementations, delay element 606 may be an investor to delay the output signal of flip-flop circuit 604 for a predefined time. In some implementations, the predefined time of delay element 606 may be used to define a high time of the local clock signal "fire."

Figure 7:
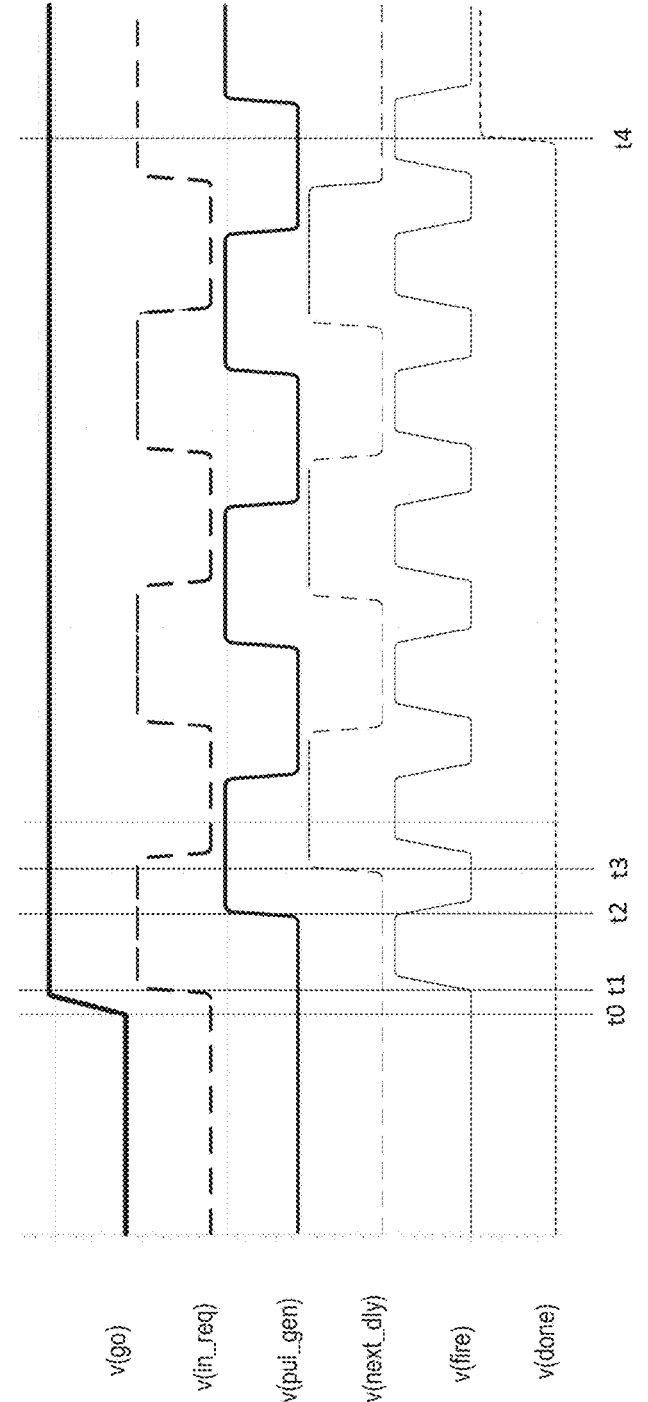
FIG. 7 illustrates the timing diagrams of an exemplary control logic circuit, according to some aspects of the present disclosure.
Figure 8:
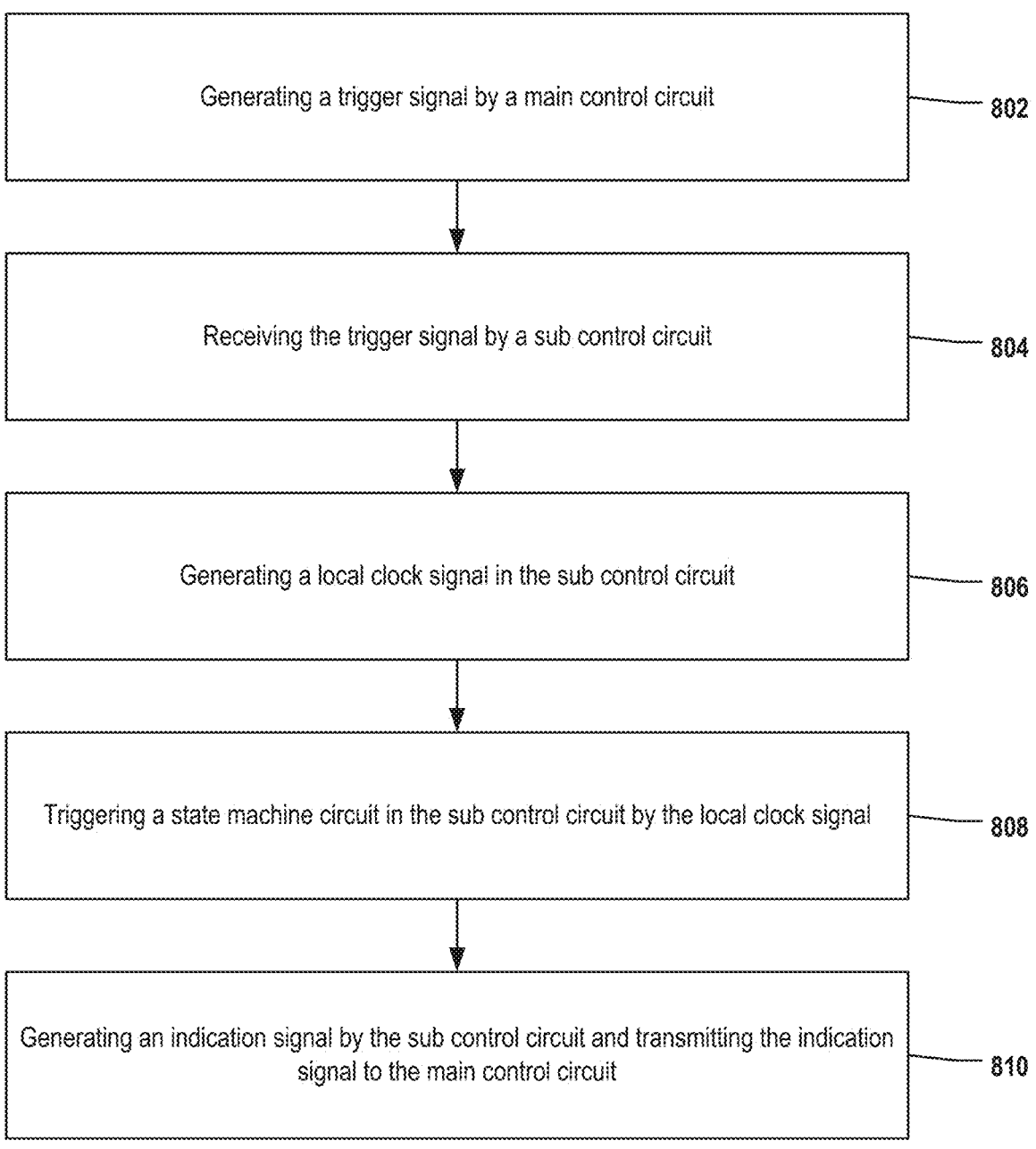
FIG. 8 illustrates a flowchart of an exemplary method of operating a peripheral circuit of a memory device, according to some aspects of the present disclosure.

FIG. 7 illustrates the timing diagrams 700 of an exemplary control logic circuit, according to some aspects of the present disclosure, and FIG. 8 illustrates a flowchart of an exemplary method 800 of operating a peripheral circuit of a memory device, according to some aspects of the present disclosure. For the purpose of better describing the present disclosure, timing diagrams 700 in FIG. 7 and method 800 in FIG. 8 will be discussed together. It is understood that the operations shown in method 800 are not exhaustive and that other operations may be performed as well before, after, or between any of the illustrated operations. Further, some of the operations may be performed simultaneously, or in a different order than shown in FIG. 7 and FIG. 8.

As shown in FIG. 7 and operations 802 and 804 of FIG. 8, at time "t0", a trigger signal "go" is generated by main control circuit 402, and the trigger signal "go" is received by sub control circuit 404. In some implementations, the trigger signal "go" and the delayed signal "next_dly" are combined to generate a request signal "in req" and the request signal "in req" is inputted to the input end of asynchronous control circuit 506.

As shown in FIG. 7 and operation 806 of FIG. 8, at time "t1", a local clock signal "fire" is generated in sub control circuit 404. In some implementations, the local clock signal "fire" is generated in asynchronous control circuit 506. In some implementations, the request signal "in req" is combined with the delayed signal "pul_gen" to generate the local clock signal "fire." In some implementations, flip-flop circuit 604 is triggered by the local clock signal "fire" to generate a flip-flop output signal, and the flip-flop output signal is provided to delay element 606 to generate the delayed signal "pul_gen" feeding back to exclusive OR gate 602.

As shown in FIG. 7, at time "t2", when the delayed signal "pul_gen" is high, exclusive OR gate 602 may combine the delayed signal "pul_gen" with the request signal "in req" to pull down the local clock signal "fire." In other words, the predefined time of delay element 606 may be used to define a high time of the local clock signal "fire."

After generating the local clock signal "fire", the local clock signal "fire" is provided to state machine circuit 508 as a clock signal to switch the states in state machine circuit 508. As shown in FIG. 7 and operation 808 of FIG. 8, at time "t1", state machine circuit 508 in sub control circuit 404 is triggered by the local clock signal "fire." In some implementations, state machine circuit 508 may include one or more than one state predefined based on different applications. State machine circuit 508 is sequentially switched when receiving the local clock signal.

In some implementations, every time when the state in state machine circuit 508 is switched to a next state, state machine circuit 508 may output a signal "next" at an output end to indicate the switching of the state. The signal "next" is provided to delay element 510 to generate the delayed signal "next_dly" at time "t3." Then, the delayed signal "next_dly" is provided to exclusive OR gate 512 to combine with the trigger signal "go" to generate the trigger signal "in_req" and exclusive OR gate 602 may combine the delayed signal "pul_gen" with the request signal "in req" to pull up the local clock signal "fire." In other words, the predefined time of delay element 510 may be used to define a low time of the local clock signal "fire."

In some implementations, when all states defined in state machine circuit 508 are sequentially and completely switched, state machine circuit 508 may output an indication signal 504 "done" at another output end to indicate the completion of data transmission, and the indication signal "done" is transmitted back to main control circuit 402. As shown in FIG. 7 and operation 810 of FIG. 8, at time "t4", indication signal "done" is generated by sub control circuit 404 and is transmitted to main control circuit 402.

By using this handshaking protocol, a local clock signal is generated in sub control circuits 404 to replace the global clock and bus in the memory device so that the power consumption on the global clock and bus can be completely saved so that the power consumption on the global clock and bus can be therefore completely saved.

Figure 9:
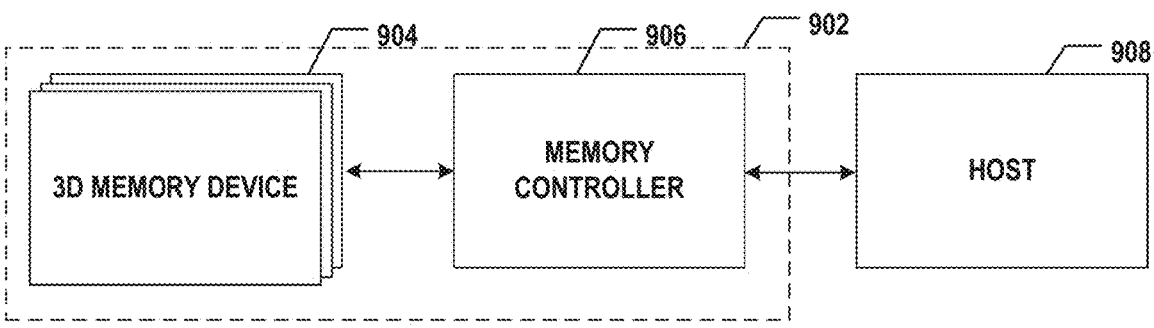
FIG. 9 illustrates a block diagram of an exemplary system having a memory device, according to some aspects of the present disclosure.

FIG. 9 illustrates a block diagram of an exemplary system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904.

Memory device 904 can be any memory device disclosed in the present disclosure, such as memory device 100. As disclosed above in detail, memory device 904 may have a controlled and predefined discharge current in the discharge operation of discharging the bit lines. Memory controller 906, such as control logic circuit 400 described above, is coupled to memory device 904 and host 908 and is configured to control memory device 904, according to some implementations. Memory controller 906 can manage the data stored in memory device 904 and communicate with host 908. For example, memory controller 906 may be coupled to memory device 904, such as memory device 100 described above, and memory controller 906 may be configured to control the operations of the memory cell through the peripheral device.

In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904. Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 10A:
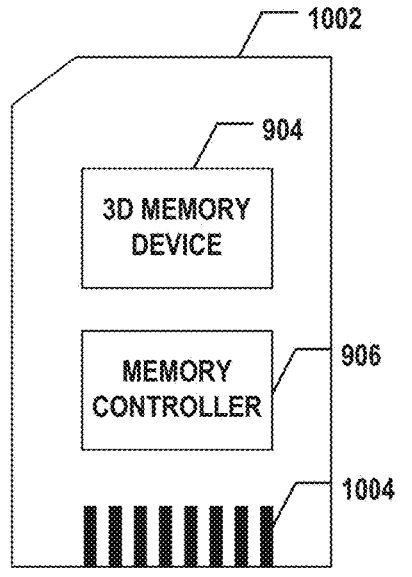
FIG. 10A illustrates a diagram of an exemplary memory card having a memory device, according to some aspects of the present disclosure.
Figure 10B:
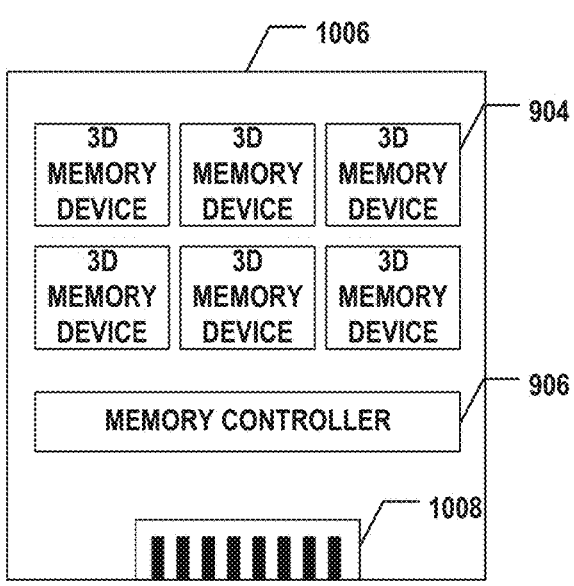
FIG. 10B illustrates a diagram of an exemplary solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 10A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 9). In another example as shown in FIG. 10B, memory controller 906 and multiple memory devices 904 may be integrated into an SSD 1006. SSD 1006 can further include an SSD connector 1008 coupling SSD 1006 with a host (e.g., host 908 in FIG. 9). In some implementations, the storage capacity and/or the operation speed of SSD 1006 is greater than those of memory card 1002.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a memory array configured to store data; and
a peripheral circuit coupled to the memory array and comprising a control logic circuit to control operations of the peripheral circuit,
wherein the control logic circuit comprises a main control circuit and at least one first sub control circuit, and the main control circuit and a first sub control circuit interact through a first trigger signal and a first indication signal,
wherein the first sub control circuit comprises:
an asynchronous control circuit configured to receive the first trigger signal from the main control circuit and generate a local clock signal, the asynchronous control circuit comprising:
a first exclusive OR gate comprising a first input end, a second input end, and a first output end, wherein the first input end is configured to receive the first trigger signal, and the first output end is configured to output the local clock signal:
a flip-flop circuit comprising an enable end coupled to the first output end of the first exclusive OR gate, a second output end, and a data end coupled to the second output end; and
a first delay element disposed between the second input end of the first exclusive OR gate and the second output end of the flip-flop circuit and a state machine circuit configured to receive the local clock signal and generate the first indication signal.
2. The memory device of claim 1, wherein the main control circuit and the first sub control circuit interact through an asynchronous control logic without a global clock signal.

3. The memory device of claim 1, wherein the asynchronous control circuit further comprises an inverter between the data end and the second output end of the flip-flop circuit.

4. The memory device of claim 1, wherein the state machine circuit comprises at least one state triggered by the local clock signal to switch a state, and the state machine circuit comprises a clock input end configured to receive the local clock signal, a third output end configured to output a next signal when switching the state, and an indication output end.

5. The memory device of claim 4, wherein the indication output end is configured to output the first indication signal when the state in the state machine circuit is switched.

6. The memory device of claim 4, further comprising:

a second exclusive OR gate comprising a third input end configured to receive the first trigger signal, a fourth input end, and a fourth output end coupled to the asynchronous control circuit; and a second delay element disposed between the fourth input end of the second exclusive OR gate and the third output end of the state machine circuit.

7. The memory device of claim 6, wherein the fourth output end of the second exclusive OR gate is coupled to the first input end of the first exclusive OR gate.

8. A control logic circuit for control operations of a peripheral circuit of a memory device, comprising:

a main control circuit and at least one sub control circuit interacting with each other through a first trigger signal and a first indication signal, where in a sub control circuit comprises:

an asynchronous control circuit configured to receive the first trigger signal and generate a local clock signal, the asynchronous control circuit comprising:

a first exclusive OR gate comprising a first input end, a second input end, and a first output end, wherein the first input end is configured to receive the first trigger signal, and the first output end is configured to output the local clock signal;

a flip-flop circuit comprising an enable end coupled to the first output end of the first exclusive OR gate, a second output end, and a data end coupled to the second output end; and a first delay element disposed between the second input end of the first exclusive OR gate and the second output end of the flip-flop circuit; and a state machine circuit configured to receive the local clock signal and generate the first indication signal.

9. The control logic circuit of claim 8, wherein the state machine circuit comprises at least one state triggered by the local clock signal to switch a state, and the state machine circuit comprises a clock input end configured to receive the local clock signal, a third output end configured to output a next signal when switching the state, and an indication output end.

10. The control logic circuit of claim 9, further comprising:

a second exclusive OR gate comprising a third input end configured to receive the first trigger signal, a fourth input end, and a fourth output end coupled to the asynchronous control circuit; and a second delay element disposed between the fourth input end of the second exclusive OR gate and the third output end of the state machine circuit.

11. The control logic circuit of claim 9, wherein the indication output end is configured to output the first indication signal when the state in the state machine circuit is switched.

12. The control logic circuit of claim 8, wherein the asynchronous control circuit further comprises an inverter between the data end and the second output end of the flip-flop circuit.

13. The control logic circuit of claim 8, further comprising:

a second exclusive OR gate comprising a third input end configured to receive the first trigger signal, a fourth input end, and a fourth output end coupled to the asynchronous control circuit; and a second delay element disposed between the fourth input end of the second exclusive OR gate and a third output end of the state machine circuit.

14. A method of operating a peripheral circuit of a memory device, comprising:

generating a trigger signal by a main control circuit;

receiving the trigger signal by a sub control circuit;

generating a local clock signal in the sub control circuit;

triggering a state machine circuit in the sub control circuit by the local clock signal; and generating an indication signal by the sub control circuit and transmitting the indication signal to the main control circuit, wherein the sub control circuit is configured to receive the trigger signal, by an asynchronous control circuit, from the main control circuit and generating, by the asynchronous control circuit, the local clock signal; and the asynchronous control circuit comprises an exclusive OR gate, a flip-flop circuit, and a delay element, and is configured to:

receive the trigger signal, by a first input end of the exclusive OR gate, and output the local clock signal, by a first output end of the exclusive OR gate; and couple an enable end of the flip-flop circuit to the first output end of the exclusive OR gate, and couple a data end of the flip-flop circuit to a second output end of the flip-flop circuit.

15. The method of claim 14, wherein receiving the trigger signal by the sub control circuit, comprises:

combining the trigger signal and a first delayed signal to generate a request signal; and transmitting the request signal to the asynchronous control circuit.

16. The method of claim 15, wherein generating the local clock signal in the sub control circuit, comprises:

combining the request signal and a second delayed signal to generate the local clock signal.

17. The method of claim 16, further comprising:

triggering the flip-flop circuit by the local clock signal to generate a flip-flop output signal; and delaying the flip-flop output signal to generate the second delayed signal.

18. The method of claim 17, wherein delaying the flip-flop output signal to generate the second delayed signal, comprises:

delaying the flip-flop output signal by the delay element.

19. The method of claim 15, wherein triggering the state machine circuit in the sub control circuit by the local clock signal, comprises:

defining at least one state in the state machine circuit; and sequentially switching a state in the state machine circuit when receiving the local clock signal.

20. The method of claim 19, further comprising:

generating a next state signal when switching the state in the state machine circuit; and delaying the next state signal to generate the first delayed signal.

* * * * *